United States Patent [19]

Roychowdhury et al.

[11] Patent Number: 6,072,947
[45] Date of Patent: Jun. 6, 2000

[54] METHOD OF MAKING AN INTEGRATED CIRCUIT INCLUDING NOISE MODELING AND PREDICTION

[75] Inventors: Jaijeet Roychowdhury, Murray Hill; Peter Feldmann, Short Hills; David Esley Long, Chatham, all of N.J.

[73] Assignee: Lucent Technologies, Inc., Murray Hill, N.J.

[21] Appl. No.: 08/933,733

[22] Filed: Sep. 23, 1997

[51] Int. Cl.[7] .................................................. G06F 17/50
[52] U.S. Cl. ........................................................ 395/500.35
[58] Field of Search ........................................ 395/500.35

[56] References Cited

U.S. PATENT DOCUMENTS

5,537,329 7/1996 Feldmann et al. ................. 395/500.05

OTHER PUBLICATIONS

Rosch, M., et al., Schnell stationdre Simulation nichtlinearer Schaltungen im Frequenzbereich, AEU, 46(3); 168–176, 1992.

Melville, R.C., et al., Efficient Multi–tone Distortion Analysis of Analog Integrated Circuits, Proc: IEEE CICC, May, 1995.

Rorer, R., et al., Computationally efficient eletronic–circuit noise calculation, IEEE J. Solid–State Ckts., SC–6(3):204–213, 1971.

Heinen, S., et al., A Unified Framework for computer–Aided Noise Analysis of Linear an Nonlinear Microwave Circuits, IEEE Trans. MTT, 39(12):2170–2175, Dec., 1991.

Rizzoli, V., et al., General Noise Analysis of Nonlinear Microwave Circuits by the Piecewise Harmonic–Balance Technique, IEEE Trans. MTT, 42(5); 807–819, May, 1994.

Strom and Signell, Analysis of Periodically Switched Linear Circuits, IEEE Trans.Ckts.Syst., CAS–24(10):531–541, Oct., 1977.

Hull and Meyer, A Systematic Approach to the Analysis of Noise in Mixers, IEEE Trans.CKts.Syst.–I: Fund. Th. Appl., 40(12):909–919, Dec., 1993.

Okumura, M., et al., Numerical Noise Analysis for Nonlinear Circuits with a Periodic Large Signal Excitation Including Cyclostationary Noise Sources, IEEE Trans. Ckts.Syst.–I:Fund. Th.Appl., 40(9):581–590, Sep., 1993.

*Primary Examiner*—Kevin J. Teska
*Assistant Examiner*—Hugh Jones

[57] ABSTRACT

A frequency-domain analysis method computes noise power spectral densities (PSDs) in nonlinear circuits. The method uses harmonic components of the periodic time-varying PSD of cyclostationary noise, i.e., harmonic power spectral densities which are deterministic functions that describe the time-varying second-order statistics of cyclostationary noise. A block-structured matrix equation is used which relates output noise statistics to input noise statistics. By exploiting Toeplitz block structure, an efficient noise calculation method requires $O(nN \log N)$ computation time and $O(nN)$ memory, where n is the circuit size and N is the number of significant harmonics in the circuit's steady state. The method successfully treats device noise sources with arbitrarily shaped PSDs (including thermal, shot, and flicker noises), handles noise input correlations and computes correlations between different outputs.

10 Claims, 8 Drawing Sheets

METHOD OF MAKING AN INTEGRATED CIRCUIT INCLUDING NOISE MODELING AND PREDICTION

FIELD OF THE INVENTION

The invention pertains to the field of design of integrated circuits. More particularly, the invention pertains to the use of a fast cyclostationary noise analysis method to produce an efficient integrated circuit (IC).

BACKGROUND OF THE INVENTION

Estimation of electrical noise is important in the design of communication circuits. Noise has a direct effect on critical specifications like SNR (signal to noise ratio) and BER (bit error rate) that must be met in designs. Due to the complexity of most modem circuit designs, computer-aided analysis using numerical techniques is the only practical means of predicting noise performance.

Existing algorithms for noise computation in nonlinear circuits require computation and memory that scale quadratically or worse with the number of nonlinear devices. Until recently, this was not a limiting factor because traditional high-frequency communication circuitry has been composed largely of linear elements and a few nonlinear devices. The present trend towards integration of RF circuitry is, however, reversing this paradigm. With IC techniques being applied to the design of on-chip RF circuitry, large numbers of nonlinear devices are being used and purely linear elements are relatively few. Existing algorithms are impractically expensive for nonlinear noise computation in such circuits.

Recently, efficient harmonic-balance algorithms for finding the steady state of large nonlinear circuits were proposed independently by Rosch and others. (See, e.g., M. Rösch and K. J. Antreich, *Schnell stationäre Simulation nichtlinearer Schaltungen im Frequenzbereich*, AEÜ, 46(3):168–176, 1992 and R. C. Melville, P. Feldmann, and J. Roychowdhury, *Efficient Multi-tone Distortion Analysis of Analog Integrated Circuits*, Proc. IEEE CICC, May 1995.) The algorithms achieve almost-linear performance by decomposing the harmonic balance jacobian matrix into simpler matrices that can be applied efficiently. This development alone does not, however, solve the problem of calculating nonlinear noise, because existing noise formulations cannot take advantage of the efficient harmonic balance decomposition.

Noise analysis in most circuit simulators has concentrated on stationary noise, motivated by the near-linear operation of communication amplifiers about their DC operating points. Existing algorithms for stationary noise (see, e.g., R. Rohrer, L. Nagel, R. Meyer, and L. Weber, *Computationally efficient electronic-circuit noise calculation*, IEEE J. Solid-State Ckts., SC-6(3):204–213, 1971) are efficient and widely used, as, for instance in the SPICE computer program. (See Thomas L. Quarles, *SPICE 3C.1 User's Guide*, University of California, Berkeley, EECS Industrial Liaison Program, University of California, Berkeley Calif. 94720, April 1989.)

For circuits such as mixers that are designed for nonlinear operation, stationary noise analysis does not suffice. Prediction of important phenomena such as noise up/down-conversion requires more general statistical models for noise. Two equivalent statistical formulations exist:

1. nonstationary or cyclostationary stochastic processes in time, and
2. stochastic functions of frequency.

Several approaches to analyzing nonlinear noise in circuits use the second model or a discrete version. (See, e.g., S. Heinen, J. Kunisch, and L. Wolff, *A Unified Framework for Computer-Aided Noise Analysis of Linear and Nonlinear Microwave Circuits,* IEEE Trans. MTT, 39(12):2170–2175, December 1991). These approaches do not consider issues of stationarity explicitly, but recognize that correlations can exist between different frequency components of the frequency-domain stochastic "process". It can be shown that correlation between different frequency components of the frequency-domain stochastic model is equivalent to nonstationarity or cyclostationarity of the time-domain stochastic model.

Rizzoli et al. (V. Rizzoli, F. Mastri, and D. Masotti, *General Noise Analysis of Nonlinear Microwave Circuits by the Piecewise Harmonic-Balance Technique,* IEEE Trans. MTT, 42(5):807–819, May 1994) propose a general algorithm for calculating noise in nonlinear circuits using harmonic balance. Noise is treated as a stochastic function of frequency in their work, extending earlier analyses of diode mixer circuits. Rizzoli et al. formulate the noise algorithm in terms of the piecewise harmonic balance algorithm. Heinen et al. (see above) extend this analysis to the MNA circuit equation formulation.

The stochastic function of frequency noise model has the disadvantage of being mathematically cumbersome in its application to circuit equations. Since Fourier transforms do not exist for almost all samples of noise, suitable limiting arguments need to be used. This has led to a lack of rigor in some approaches adopting this model. An approach that combines rigor with relative simplicity is to compute two-dimensional/time-varying PSD (power spectral densities) or autocorrelation functions for noise within the circuit. Ström and Signell (*Analysis of Periodically Switched Linear Circuits,* IEEE Trans. Ckts. Syst., CAS-24(10):531–541, October 1977) apply these concepts to switched linear circuits to obtain closed-form expressions for computer implementation. Using time-varying and two-dimensional spectral density functions, they obtain expressions for the output noise of a switched circuit excited by stationary noise sources. They also proved that low-pass filtering of cyclostationary noise results in stationary output noise. Hull and Meyer (*A Systematic Approach to the Analysis of Noise in Mixers,* IEEE Trans. Ckts. Syst.-I: Fund. Th. Appl., 40(12):909–919, December 1993) base their noise analysis on frequency shifting of stationary PSD functions, without explicitly considering cyclostationary effects. However, they use the fact that lowpass filtering restores stationarity in their analysis. Okumura et al. (M. Okumura, H. Tanimoto, T. Itakura, and T. Sugawara, *Numerical Noise Analysis for Nonlinear Circuits with a Periodic Large Signal Excitation Including Cyclostationawy Noise Sources,* IEEE Trans. Ckts. Syst.-I: Fund. Th. Appl., 40(9):581–590, September 1993) use time-varying PSD concepts to formulate an essentially harmonic balance algorithm for noise computation. Their model for cyclostationary noise inputs, however, consists of a sum of pulse-function weighted independent stationary processes, which assumes short-term correlations and therefore does not extend to modulated flicker noise. Nevertheless, they obtain a valid expression for average output noise power and verify their algorithm with measurements.

The above approaches all use the periodicity of the steady state to justify assumptions about the cyclostationarity of noise. A more general approach using time-varying autocorrelation functions, but without the restriction of cyclostationarity, is taken by Dernir. (A. Demir, *Time*

*Domain Non Monte Carlo Noise Simulation For Nonlinear Dynamic Circuits with Arbitrary Excitations,* Technical Report Memorandum No. UCI3/ERL M94/39, EECS Dept., Univ. Calif. Berkeley, 1994.) In this approach, a sequence of stochastic linear time-varying differential equations (SDEs) is derived for the circuit excited by white noise sources. By solving these SDEs numerically in the time domain, non-stationary and transient second-order statistics of the noise can be calculated. Although this approach is limited technically to white noise inputs, colored input noise (e.g., flicker noise) is treated using artificial PSD shaping networks within the circuit.

While the methods mentioned above are useful for a large class of microwave circuits, their computation and memory requirements grow at least quadratically as a function of nonlinear device count. They are therefore often impractical for analyzing integrated RF circuits, which typically contain many nonlinear devices.

SUMMARY OF THE INVENTION

A new frequency-domain analysis method is presented for computing noise power spectral densities (PSDs) in nonlinear circuits. The method uses harmonic components of the periodic time-varying PSD of cyclostationary noise in its formulation. The key feature of the method is the formulation of the equations relating second-order noise statistics in block-structured matrix form. This formulation enables harmonic balance based noise computation to be performed in O(nN log N) time and O(nN) memory, where n represents circuit size and N the number of harmonics of the large-signal steady state. The method treats device noise sources with arbitrarily shaped PSDs (including thermal, shot and flicker noises), handles noise input correlations and computes correlations between different outputs.

The use of harmonic components of the PSD also provides an effective visualization of the propagation of cyclostationary noise through nonlinear systems. As an illustration, an analysis is carried out to establish the non-intuitive result that bandpass filtering of cyclostationary noise can result in stationary noise.

The new analysis method is applied to large-signal nonlinear circuit examples demonstrating noise folding and interaction between different cyclostationary PSD components. Results using the new method are validated against extensive Monte-Carlo noise simulations.

The new formulation is in terms of harmonic power spectral densities, deterministic functions that describe the time-varying second-order statistics of cyclostationary noise. In this invention, a block-structured matrix equation is obtained relating output noise statistics to input noise statistics. By exploiting Toeplitz block structure, an efficient noise calculation procedure requiring O(nN log N) computation and O(nN) memory is obtained (n is the circuit size, N the number of significant harmonics in its steady state).

Using the new analysis method, it is possible to compute the total noise at a specific output and correlations between noise at different outputs, as well as individual contributions from each noise generator to a specific output. Moreover, the noise formulation is capable of taking into account elaborate noise generators with any PSD shape (e.g., modulated shot, thermal and flicker noises) and can also handle correlated generators efficiently.

By analyzing the filtering of noise using the new formulation, it is shown that one-sided (single-sideband) filtering of cyclostationary noise removes cyclostationary components to leave stationary noise. This non-intuitive result is confirmed by simulation with the new analysis method and also through extensive Monte-Carlo simulations. Other circuit examples are presented to illustrate the effects of large-signal modulation on noise performance.

DETAILED DESCRIPTION OF THE INVENTION

Figure 1:
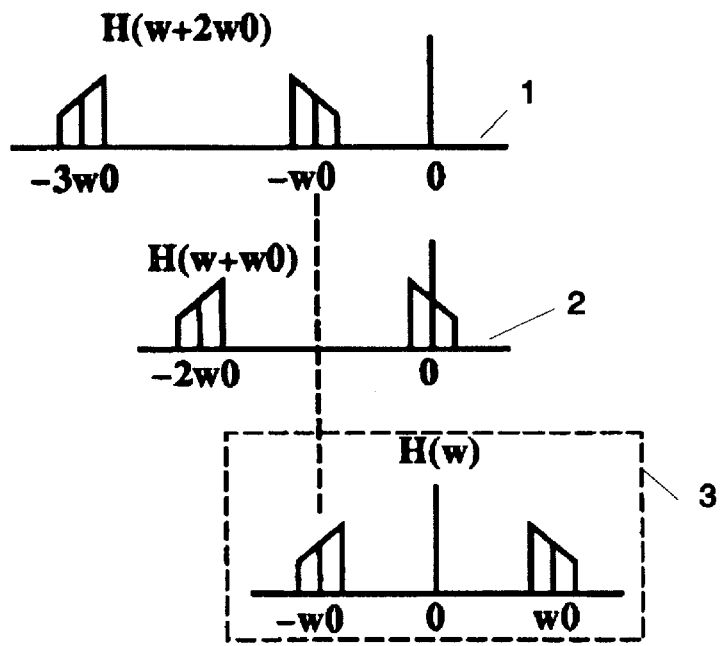
FIG. 1 shows graphs of $H(\omega)$ overlaid with $H(\omega+i\omega_o)$ for i=2, 1, −1 and −2.

A. The Efficient Cyclostationary Noise Computation Analysis Method

The equations of any nonlinear circuit can be expressed in the form:

$$\dot{q}(x(t))+f(x(t))+b(t)+Au(t)=0 \qquad (1)$$

where: x(t) are the time-domain circuit variables or unknowns, b(t) is a vector of large-signal excitations, f and q represent the "resistive" and "dynamic" elements of the circuit respectively. The last term, Au(t), represents "small" perturbations to the system, e.g., from noise sources in devices. All these quantities are vectors of dimension n. The term u(t) has dimension m, representing the number of noise sources in the circuit. A is an incidence matrix of size n×m which describes how these noise sources are connected to the circuit.

Since the noise sources u(t) are small, their effects are analyzed by perturbing the noise-free solution of the circuit. Let x*(t) represent the large signal solution of Equation 1 with u(t) set to zero. Performing a time-varying linearization of Equation 1 about x*, the following linearized small-signal differential equation is obtained:

$$C(t)\dot{x}+G(t)x+Au(t)=0 \quad (2)$$

The x(t) in Equation 2 (x(t) is abbreviated as x using standard terminology for discussing differential equations) now represents the small-signal deviations of the perturbed solution of Equation 1 from the noise-free solution x*. C(t) and G(t) are the derivative matrices of f(.) and q(.):

$$C(t) = \frac{\partial q(x)}{\partial x}\bigg|_{x=x^*}, \quad G(t) = \frac{\partial f(x)}{\partial x}\bigg|_{x=x^*} + \frac{\partial^2 q(x)}{\partial x^2}\bigg|_{x=x^*} \dot{x}^*$$

Equation 2 is a linear differential equation with time-varying coefficients. It therefore describes a linear time-varying (LTV) system with input u(t) and output x(t). The LTV system is characterized completely by its time-varying impulse response (or kernel) $h(t_2, t_1)$, a n×m matrix. The dependence of h on C(t), G(t) and A is examined in Section C, below. The propagation of noise through LTV systems is analyzed next.

B. Propagation of Noise through a Linear Time-Varying (LTV) System

The input-output relation of the LTV system described by Equation 2 is:

$$x(t_2) = \int_{-\infty}^{\infty} h(t_2, t_1)u(t_1)dt_1 \quad (3)$$

When u(t) is a stochastic process, Equation 3 holds for each sample of the process; hence x(t) also becomes a stochastic process. It is desirable to obtain a relation between the second-order statistics, or covariances, of the input and output processes. Assuming u(t) and x(t) to be general nonstationary processes, their covariance matrices are defined as:

$$R_{uu}(t_1,t_2)=E[u(t_1)u^T(t_2)], R_{xx}(t_1,t_2)=E[x(t_1)x^T(t_2)] \quad (4)$$

A straightforward analysis establishes the following relation between $R_{xx}$ and $R_{uu}$:

$$R_{xx}(t_1, t_2) = \int_{-\infty}^{\infty}\int_{-\infty}^{\infty} h(t_1, \tau_1)R_{uu}(\tau_1, \tau_2)h^T(t_1, \tau_2)d\tau_1 d\tau_2 \quad (5)$$

Most nonlinear systems of practical interest involve periodic waveforms. The assumption is made next that x*(t), the unperturbed solution of Equation 1, is periodic with period T. This implies that C(t) and G(t) of Equation 2 are also T-periodic, therefore $h(t_2, t_1)$ describes a linear periodic time-varying (LPTV) system. The term $h(t_2, t_1)$ is therefore periodic with respect to displacements of T in both its arguments, i.e., $$h(t_2+T,t_1+T)=h(t_2,t_1) \quad (6)$$

The periodicity of h implies that it can be expanded in a Fourier series:

$$h(t_2, t_1) = \sum_{i=-\infty}^{\infty} h_i(t_2 - t_1)e^{ji\omega_0 t_2}, \omega_0 = \frac{2\pi}{T} \quad (7)$$

The $h_i$ in the above equation are functions of one variable and are referred to as the harmonic impulse responses of the LPTV system. Moreover, their Fourier transforms are denoted by $H_i$ and referred to as the harmonic transfer functions of the LPTV system, i.e., $$H_i(\omega) = \int_{-\infty}^{\infty} h_i(t)e^{-j\omega t}dt \quad (8)$$

Using the assumption of periodicity of the LPTV system and the definition of $H_i$, Equation 5 is next converted to the frequency domain. In order to do so, two-dimensional power spectral densities are defined by taking two-dimensional Fourier transforms of $R_{xx}$ and $R_{uu}$:

$$S_{xx}(\omega_1, \omega_2) = \int_{-\infty}^{\infty}\int_{-\infty}^{\infty} R_{xx}(t_1, t_2)e^{-j\omega_1 t_1}e^{-j\omega_2 t_2}dt_1 dt_2 \quad (9)$$

$$S_{uu}(\omega_1, \omega_2) = \int_{-\infty}^{\infty}\int_{-\infty}^{\infty} R_{uu}(t_1, t_2)e^{-j\omega_1 t_1}e^{-j\omega_2 t_2}dt_1 dt_2 \quad (10)$$

By two-dimensional Fourier transforming Equation 5 and using the definitions in Equations 8–10, an expression relating $S_{xx}$ and $S_{uu}$ is obtained:

$$S_{xx}(\omega_1, \omega_2) = \sum_{i=-\infty}^{\infty}\sum_{k=-\infty}^{\infty} H_k(\omega_1 - k\omega_0)S_{uu}(\omega_1 - k\omega_0, \omega_2 - i\omega_0)H_i^T(\omega_2 - i\omega_0) \quad (11)$$

Equation 11 describes the propagation of nonstationary noise through an LPTV system by relating the two-dimensional spectral densities of the input and output. The assumption that both input and output noises are cyclostationary is now introduced. The cyclostationary assumption implies that $R_{xx}$ and $R_{uu}$ do not change if T is added to both arguments, i.e., $$R_{xx}(t_1+T,t_2+T)=R_{xx}(t_1,t_2), R_{uu}(t_1+T,t_2+T)=R_{uu}(t_1,t_2) \quad (12)$$

Hence both can be expressed as Fourier series:

$$R_{xx}(t_1, t_2) = \sum_{i=-\infty}^{\infty} R_{xx_i}(t_2 - t_1)e^{ji\omega_0 t_2},$$

$$R_{uu}(t_1, t_2) = \sum_{i=-\infty}^{\infty} R_{uu_i}(t_2 - t_1)e^{ji\omega_0 t_2} \quad (13)$$

$R_{xx_i}$ and $R_{uu_i}$ are functions of one variable and are referred to as the harmonic covariances of the output and input noise respectively. Their (one-dimensional) Fourier transforms are denoted by $S_{xxi}$ and $S_{uui}$ and referred to as harmonic PSDs (HPSDs), i.e., $$S_{xx_i}(\omega) = \int_{-\infty}^{\infty} R_{xx_i}(t)e^{-j\omega t}dt, S_{uu_i}(\omega) = \int_{-\infty}^{\infty} R_{uu_i}(t)e^{-j\omega t}dt \quad (14)$$

The harmonic covariances and PSDs have simple physical interpretations. $R_{xx}$ (t,t) represents the time-varying power of the cyclostationary noise; hence by Equation 14, $R_{uui}$ (0) (the harmonic covariances evaluated at 0) represent the Fourier components of the periodically varying noise power. In particular, $R_{xx0}$ (0) is the average value, or stationary component, of the power. From the definition of the harmonic PSDs, it follows that the harmonic covariances evaluated at 0 are equal to the corresponding harmonic PSDs integrated over the entire frequency axis. Hence $S_{xx0}(\alpha)$ integrated equals the stationary component of the output noise power. $S_{xx0}$ and $S_{uu0}$ are therefore termed stationary PSDs.

When the T-periodic assumption of Equation 12 and the definitions of Equations 13 and 14 are applied to Equations 9 and 10, the following form is obtained for the two-dimensional power spectral densities $S_{xx}$ and $S_{uu}$:

$$S_{xx}(\omega_1, \omega_2) = \sum_{i=-\infty}^{\infty} S_{xx_i}(-\omega_1)\delta(\omega_1 + \omega_2 - i\omega_0), \tag{15}$$

$$S_{uu}(\omega_1, \omega_2) = \sum_{i=-\infty}^{\infty} S_{uu_i}(-\omega_1)\delta(\omega_1 + \omega_2 - i\omega_0),$$

Using Equation 15, the relation between the two-dimensional power spectral densities (Equation 11) is rewritten in terms of the (one-dimensional) harmonic PSDs $S_{xxi}$ and $S_{uui}$:

$$S_{xx_l}(-\omega) = \tag{16}$$
$$\sum_{k=-\infty}^{\infty} \sum_{i=-\infty}^{\infty} H_i(\omega - i\omega_0) S_{uu_k}(-\omega + i\omega_0) H^T_{l-(i+k)}(-\omega + (i+k)\omega_0)$$

An interesting and useful observation about Equation 16 is that the output harmonic $l$ appears only in the last term $H^T_{l-(j+k)}$. This suggests that Equation 16 can be written in block matrix form. It can be verified by direct multiplication that Equation 16 is equivalent to the following block matrix equation:

$$S_{xx}(\omega) = H(\omega) S_{uu}(\omega) H^*(\omega) \tag{17}$$

where $H^*$ denotes the Hermitian of $H$ $S_{xx}$, $S_{uu}$, and $H$ are block matrices with an infinite number of blocks, given by (denoting $\omega + k\omega_0$ by $\omega^k$ for conciseness):

$$\mathcal{H}(\omega) = \begin{bmatrix} \vdots & \vdots & \vdots & \vdots & \vdots \\ \cdots & H_0(\omega^2) & H_1(\omega^1) & H_2(\omega^0) & H_3(\omega^{-1}) & H_4(\omega^{-2}) & \cdots \\ \cdots & H_{-1}(\omega^2) & H_0(\omega^1) & H_1(\omega^0) & H_2(\omega^{-1}) & H_3(\omega^{-2}) & \cdots \\ \cdots & H_{-2}(\omega^2) & H_{-1}(\omega^1) & H_0(\omega^0) & H_1(\omega^{-1}) & H_2(\omega^{-2}) & \cdots \\ \cdots & H_{-3}(\omega^2) & H_{-2}(\omega^1) & H_{-1}(\omega^0) & H_0(\omega^{-1}) & H_1(\omega^{-2}) & \cdots \\ \cdots & H_{-4}(\omega^2) & H_{-3}(\omega^1) & H_{-2}(\omega^0) & H_{-1}(\omega^{-1}) & H_0(\omega^{-2}) & \cdots \\ \vdots & \vdots & \vdots & \vdots & \vdots \end{bmatrix} \tag{18}$$

$$S_{xx}(\omega) = \begin{bmatrix} \vdots & \vdots & \vdots & \vdots & \vdots \\ \cdots & S_{xx_0}(-\omega^2) & S_{xx_1}(-\omega^2) & S_{xx_2}(-\omega^2) & S_{xx_3}(-\omega^2) & S_{xx_4}(-\omega^2) & \cdots \\ \cdots & S_{xx_{-1}}(-\omega^1) & S_{xx_0}(-\omega^1) & S_{xx_1}(-\omega^1) & S_{xx_2}(-\omega^1) & S_{xx_3}(-\omega^1) & \cdots \\ \cdots & S_{xx_{-2}}-\omega^0) & S_{xx_{-1}}(-\omega^0) & S_{xx_0}(-\omega^0) & S_{xx_1}(-\omega^0) & S_{xx_2}(-\omega^0) & \cdots \\ \cdots & S_{xx_{-3}}(-\omega^{-1}) & S_{xx_{-2}}(-\omega^{-1}) & S_{xx_{-1}}(-\omega^{-1}) & S_{xx_0}(-\omega^{-1}) & S_{xx_1}(-\omega^{-1}) & \cdots \\ \cdots & S_{xx_{-4}}(-\omega^{-2}) & S_{xx_{-3}}(-\omega^{-2}) & S_{xx_{-2}}(-\omega^{-2}) & S_{xx_{-1}}(-\omega^{-2}) & S_{xx_0}(-\omega^{-2}) & \cdots \\ \vdots & \vdots & \vdots & \vdots & \vdots \end{bmatrix} \tag{19}$$

$$S_{uu}(\omega) = \begin{bmatrix} \vdots & \vdots & \vdots & \vdots & \vdots \\ \cdots & S_{uu_0}(-\omega^2) & S_{uu_1}(-\omega^2) & S_{uu_2}(-\omega^2) & S_{uu_3}(-\omega^2) & S_{uu_4}(-\omega^2) & \cdots \\ \cdots & S_{uu_{-1}}(-\omega^1) & S_{uu_0}(-\omega^1) & S_{uu_1}(-\omega^1) & S_{uu_2}(-\omega^1) & S_{uu_3}(-\omega^1) & \cdots \\ \cdots & S_{uu_{-2}}-\omega^0) & S_{uu_{-1}}(-\omega^0) & S_{uu_0}(-\omega^0) & S_{uu_1}(-\omega^0) & S_{uu_2}(-\omega^0) & \cdots \\ \cdots & S_{uu_{-3}}(-\omega^{-1}) & S_{uu_{-2}}(-\omega^{-1}) & S_{uu_{-1}}(-\omega^{-1}) & S_{uu_0}(-\omega^{-1}) & S_{uu_1}(-\omega^{-1}) & \cdots \\ \cdots & S_{uu_{-4}}(-\omega^{-2}) & S_{uu_{-3}}(-\omega^{-2}) & S_{uu_{-2}}(-\omega^{-2}) & S_{uu_{-1}}(-\omega^{-2}) & S_{uu_0}(-\omega^{-2}) & \cdots \\ \vdots & \vdots & \vdots & \vdots & \vdots \end{bmatrix} \tag{20}$$

Equation 17 expresses the relation between the output and input harmonic PSDs compactly using block matrices. Note from Equation 19 that the output harmonic PSDs evaluated at $\omega$ ($=\omega^0$) are given by the central block-row of $S_{xx}$. To obtain this row, denoted by $S^T_{xx(\cdot,0)}$, Equation 17 is transposed and postmultiplied by a unit block-vector:

$$S^T_{xx(\cdot,0)}(\omega) = \overline{H}(\omega) S^T_{uu}(\omega) H^T(\omega) E_0 \tag{21}$$

where $$E_0 = \begin{bmatrix} \vdots \\ 0 \\ I_{n \times n} \\ 0 \\ \vdots \end{bmatrix} \leftarrow 0^{th} \text{ block} \tag{22}$$

$I_{n \times n}$ represents the n×n identity matrix. Let $S^T_{xx(\cdot,0)(\cdot,p)}(\omega)$ represent the pth column of $S^T_{xx(\cdot,0)}(\omega)$, i.e., the harmonic PSDs of the self-powers and cross-powers of the pth output $x_p$. To pick this pth column, Equation 21 is post-multiplied by the unit vector $e_p$ to obtain:

$$S^T_{xx(\cdot,0)(\cdot,p)}(\omega) = \overline{H}(\omega) S^T_{uu}(\omega) H^T(\omega) E_0 e_p \tag{23}$$

where $$e_p = \begin{bmatrix} 0 \\ \vdots \\ 1 \\ \vdots \\ 0 \end{bmatrix} \begin{matrix} \leftarrow \text{1st entry} \\ \\ \leftarrow p\text{th entry} \\ \\ \leftarrow n\text{th entry} \end{matrix} \qquad (24)$$

Note that $E_0 e_p$ is a vector. Hence the computation of $S^T_{xx(\cdot,0)_{(\cdot,p)}}(\omega)$ in Equation 23 can be performed by matrix-vector products with the block matrices $H^T$, $S^T_{uu}$, and $\overline{H}$. Despite the fact that these matrices are, in general, dense, products with them can be performed efficiently, as discussed next in Sections C and D.

Equation 23, above, is the equation which describes the desired result of the computation—the left side of the equation describes the noise at a given output to the circuit being examined.

C. Fast Application of $H^T$ and $\overline{H}$ exploiting harmonic balance

To apply $H^T$ and $\overline{H}$ efficiently to a vector, it is necessary to represent H in terms of C(t), G(t) and A (refer to Equation 2). Since C(t) and G(t) are T-periodic, they are expanded in Fourier series:

$$C(t) = \sum_{i=-\infty}^{\infty} C_i e^{ji\omega_0 t}, \; G(t) = \sum_{i=-\infty}^{\infty} G_i e^{ji\omega_0 t} \qquad (25)$$

The Fourier coefficients $C_i$ and $G_i$ are referred to as the harmonics of C(t) and G(t) respectively. H is expressed in terms of these harmonics as:

$$H(\omega) = J^{-1}(\omega)A, J(\omega) = G + j\Omega(\omega)C \qquad (26)$$

where $$C = \begin{bmatrix} \ddots & \vdots & \vdots & \vdots & \vdots & \vdots & \\ \cdots & C_0 & C_{-1} & C_{-2} & C_{-3} & C_{-4} & \cdots \\ \cdots & C_1 & C_0 & C_{-1} & C_{-2} & C_{-3} & \cdots \\ \cdots & C_2 & C_1 & C_0 & C_{-1} & C_{-2} & \cdots \\ \cdots & C_3 & C_2 & C_1 & C_0 & C_{-1} & \cdots \\ \cdots & C_4 & C_3 & C_2 & C_1 & C_0 & \cdots \\ & \vdots & \vdots & \vdots & \vdots & \vdots & \ddots \end{bmatrix} \qquad (27)$$

$$\mathcal{G} = \begin{bmatrix} \ddots & \vdots & \vdots & \vdots & \vdots & \vdots & \\ \cdots & G_0 & G_{-1} & G_{-2} & G_{-3} & G_{-4} & \cdots \\ \cdots & G_1 & G_0 & G_{-1} & G_{-2} & G_{-3} & \cdots \\ \cdots & G_2 & G_1 & G_0 & G_{-1} & G_{-2} & \cdots \\ \cdots & G_3 & G_2 & G_1 & G_0 & G_{-1} & \cdots \\ \cdots & G_4 & G_3 & G_2 & G_1 & G_0 & \cdots \\ & \vdots & \vdots & \vdots & \vdots & \vdots & \ddots \end{bmatrix} \qquad (28)$$

$$\Omega(\omega) = \begin{bmatrix} \ddots & & & & & \\ & \omega^{-2}I & & & & \\ & & \omega^{-1}I & & & \\ & & & \omega^0 I & & \\ & & & & \omega^1 I & \\ & & & & & \omega^2 I \\ & & & & & & \ddots \end{bmatrix} \qquad (29)$$

$$\mathcal{A} = \begin{bmatrix} \ddots & & & & & \\ & A & & & & \\ & & A & & & \\ & & & A & & \\ & & & & A & \\ & & & & & A \\ & & & & & & \ddots \end{bmatrix} \qquad (30)$$

$J(\omega)$ is known as the conversion matrix of the circuit. $J(0)$ is the Jacobian matrix of the harmonic balance equations at the circuit's steady state $x^*$.

For numerical computation, the infinite block matrices in Equations 18–20 and 27–30 are truncated to a finite number of blocks N=2M+1. M is the largest positive harmonic considered. For the purposes of the analysis, it is assumed that no significant harmonic PSD of degree greater than M/2 exists for the input noise u(t) or the output noise x(t). Since the energy content of the $i^{th}$ harmonic is always a diminishing function of i in practical RF circuits, a value for M can always be found satisfying this assumption.

With this assumption, it can be shown that the Toeplitz block structure in the above matrices can be approximated by circulant block structure without loss of accuracy in the matrix-vector product. For example, C truncated to N=7 blocks can be approximated by $\overset{\circ}{C}$, given by:

$$\overset{\circ}{C} = \begin{bmatrix} C_0 & C_{-1} & C_{-2} & C_{-3} & C_3 & C_2 & C_1 \\ C_1 & C_0 & C_{-1} & C_{-2} & C_{-3} & C_3 & C_2 \\ C_2 & C_1 & C_0 & C_{-1} & C_{-2} & C_{-3} & C_3 \\ C_3 & C_2 & C_1 & C_0 & C_{-1} & C_{-2} & C_{-3} \\ C_{-3} & C_3 & C_2 & C_1 & C_0 & C_{-1} & C_{-2} \\ C_{-2} & C_{-3} & C_3 & C_2 & C_1 & C_0 & C_{-1} \\ C_{-1} & C_{-2} & C_{-3} & C_3 & C_2 & C_1 & C_0 \end{bmatrix} \qquad (31)$$

Note that the fourth, fifth and sixth sub-diagonals and super-diagonals of $\overset{\circ}{C}$ differ from those of C truncated to 7 blocks. Matrix-vector products with $\overset{\circ}{C}$ and the truncated C, however, produce identical results up to the first harmonic location if the vector being multiplied contains no significant components in the second and third harmonic locations.

The utility of the circulant approximation is that it enables $\overset{\circ}{C}$ and $\overset{\circ}{G}$ to be decomposed into products of sparse block-diagonal matrices, permutations, and Fourier transform (DFT) matrices. This enables matrix-vector products with $\overset{\circ}{C}$ and $\overset{\circ}{G}$ to be performed as a sequence of products with sparse block-diagonal matrices (O(nN) operations), permutations (no cost), and Fourier transforms (O(nN log n) operations); hence the overall computation is O(nN log N). Further, since only the sparse block-diagonal matrices need to be stored, the memory requirement is O(nN). Note that $\Omega(\omega)$ is a diagonal matrix with a-priori known entries $\omega^k$, hence its application to a vector is O(nN) in computational cost, with no memory required for its storage. The net effect of the circulant approximation, therefore, is that $J(\omega)$ can be applied to a vector in O(nN log N) computation and O(nN) memory. From Equation 26, it follows that to obtain the required matrix-vector product with $H(\omega)$, matrix-vector products with A and $J^1(\omega)$ are necessary. Since A is a sparse block-diagonal matrix with identical blocks A (the noise source incidence matrix), it can be applied in O(nN) time and O(n) memory. Iterative linear solvers can obtain the matrix-vector product with $J^{-1}$ using only matrix-vector products with J. The use of iterative linear techniques, together with the decomposition of J allowing its application in O(nN log N) time, is the key to the fast harmonic balance analysis methods of Rosch and Melville et al. referred to in the background section, above. With suitable preconditioning included in the iterative solution, the number of J-vector products required to compute a $J^{-1}$-vector product is small and approximately independent of the size of J. Hence the $J^{-1}$-vector product can be computed in approximately O(nN log N) time and O(nN) memory, leading to the same computation and memory requirements for the desired product with H.

From Section A, products are required with $H^T$ and $\overline{H}$ for cyclostationary noise computation. Application of $H^T$ is carried out using the same decomposition and iterative linear methods as for H, but using transposes of the matrices involved. The product with $\overline{H}$ is carried out using the relation $\overline{H}z = \overline{Hz}$.

D. Fast Application of $S^T_{uu}$

The principal sources of noise in circuits are thermal, shot, and flicker (1/f) noises from devices. When the linearized small-signal circuit (Equation 2) is time-invariant, these noise sources are stationary stochastic processes with known power spectral densities. Thermal and shot noises are white, with PSD values that are constant and independent of frequency, whereas flicker noise PSDs exhibit a 1/f variation with frequency. The expressions for the power spectral densities of these noise sources typically involve some component of the time-invariant large-signal steady state. For example, the PSD of the shot noise current $u_D(t)$ across a diode's p-n junction is proportional to the DC current $I_D$ through the junction, i.e.:

$$S_{U_D U_D}(\omega) = 2qI_D \quad (32)$$

where $S_{U_D U_D}(\omega)$ is the (stationary) PSD of the shot noise and q is the electronic charge.

From the viewpoint of second-order statistics, the diode&s shot noise is equivalent to the hypothetical process generated by multiplying a white noise process w(t) of PSD value 2q by a constant factor of $\sqrt{I_D}$:

$$u_D(t) = \sqrt{I_D}\, w(t), \quad S_{ww}(\omega) = 2q \quad (33)$$

For this reason, shot noise is often said, in a loose sense, to be proportional to $\sqrt{I_D}$.

For circuits operating in time-invariant steady state, expressions for PSDs of stationary noise generators are well established from theoretical considerations and/or through measurement. For circuits operating in time-varying steady state, unfortunately, there are as yet no stochastic models for the nonstationary noise generation process that are well established. Nevertheless, there is general consensus that for white processes like shot and thermal noise, the generated nonstationary or cyclostationary noise can be represented by the modulation of stationary white noise by deterministic time-varying parameters that depend on components of the large-signal steady state. For the diode shot noise example above, Equation 33 generalizes to:

$$u_D(t) = \sqrt{I_D(t)}\, w(t), \quad S_{ww}(\omega) = 2q \quad (34)$$

where $I_D(t)$ is a time-varying waveform. Arguments supporting this deterministic modulation model are based on the short-term nature of the autocorrelations of thermal and shot noise. (See, e.g., A. Demir, *Time Domain Non Monte Carlo Noise Simulation For Nonlinear Dynamic Circuits with Arbitrary Excitations*, Technical Report Memorandum No. UCI3/ERL M94/39, EECS Dept., Univ. Calif Berkeley, 1994.)

For noise with long-term correlations (notably flicker noise), there is a general belief that the above deterministic modulation of stationary noise model is inadequate. The physical processes responsible for long-term correlations are expected to be modified by the time-varying large-signal waveforms. Unfortunately, neither theoretical analyses nor experimental data are available at this time, to the inventors' knowledge, to validate the modulated stationary noise model or propose an alternative. Demir uses the modulated stationary noise model for analyzing nonstationary flicker noise, and this model also appears to be commonly used among designers of RF circuits. The modulated stationary noise model is therefore adopted work for all cyclostationary noise generators, but it is to be understood that other models are expected to be developed in the future which might be used in the method of the invention. Under this noise generation model, the noise input u(t) in Equation 2 can be expressed as:

$$u(t) = M(t)u_s(t) \quad (35)$$

where $u_s(t)$ is an m-dimensional vector of stationary noise sources and M(t) is a m×m diagonal matrix of T-periodic deterministic modulations.

Equation 17 can be used to analyze the relation between statistics of u(t) and $u_s(t)$ by recognizing that Equation 35 represents an LTV system with input $u_s(t)$ and output u(t). The time-varying impulse response of the LTV system is:

$$h(t_2, t_1) = \delta(t_2 - t_1)M(t_2) = \sum_{i=-\infty}^{\infty} M_i \delta(t_2 - t_1) e^{ji\omega_0 t_2} \quad (36)$$

$M_i$ denote the Fourier coefficients of the periodic modulation M(t). The harmonic transfer functions $H_i(\omega)$ are independent of $\omega$ and simply equal to $M_i$. Equation 17 applied to this LTV system results in the following block-matrix relation between the harmonic PSDs of u(t) and $u_s(t)$:

$$S_{uu}(\omega) = MS_{u_s u_s}(\omega)M^* \quad (37)$$

$S_{u_s u_s}(\omega)$ represents the block Toeplitz matrix of the harmonic PSDs of the stationary noise sources. Since the sources are stationary, all their harmonic PSDs are zero except for the stationary PSD $S_{u_{s0} u_{s0}}(\omega)$; hence $S_{u_s u_s}(\omega)$ is block diagonal:

$$S_{u_s u_s}(\omega) = \begin{bmatrix} \ddots & & & & & \\ & S_{u_s u_{s0}}(-\omega^2) & & & & \\ & & S_{u_s u_{s0}}(-\omega^1) & & & \\ & & & S_{u_s u_{s0}}(-\omega^0) & & \\ & & & & S_{u_s u_{s0}}(-\omega^{-1}) & \\ & & & & & S_{u_s u_{s0}}(-\omega^{-2}) \\ & & & & & & \ddots \end{bmatrix} \quad (38)$$

M in Equation 37 is block Toeplitz with $M_i$ in the diagonals:

$$\mathcal{M} = \begin{bmatrix} \vdots & \vdots & \vdots & \vdots & \vdots & \\ \cdots & M_0 & M_1 & M_2 & M_3 & M_4 & \cdots \\ \cdots & M_{-1} & M_0 & M_1 & M_2 & M_3 & \cdots \\ \cdots & M_{-2} & M_{-1} & M_0 & M_1 & M_2 & \cdots \\ \cdots & M_{-3} & M_{-2} & M_{-1} & M_0 & M_1 & \cdots \\ \cdots & M_{-4} & M_{-3} & M_{-2} & M_{-1} & M_0 & \cdots \\ \vdots & \vdots & \vdots & \vdots & \vdots & \end{bmatrix} \quad (39)$$

Using Equation 37, the product of $S_{uu}$ with a vector can be performed through matrix-vector products with the matrices M, M* and $S_{u_s u_{s0}}$. Products with the block-Toeplitz matrices M and M* can be performed in O(mN log N) time and O(mN) memory, approximating M by a block-circulant matrix and applying the same decomposition as for G in Section C above. Application of the block-diagonal matrix $S_{u_s u_s}(\omega)$ is equivalent to N matrix vector products with $S_{u_s u_{s0}}(\bullet)$ If the device noise generators are uncorrelated, $S_{u_s u_{s0}}(\bullet)$ is diagonal. If correlations exist, they are usually between small groups of noise generators, hence $S_{u_s u_{s0}}(\bullet)$ is sparse. In either case, each product with $S_{u_s u_{s0}}(\bullet)$ is O(m) in computation with no storage required. Hence matrix-vector products with $S_{u_s u_{s0}}$ use O(Nm) time and O(l) memory. The overall matrix-vector product with $S_{uu}$ can therefore be performed in O(mN log N) time and O(mN) memory.

It should be noted that the noise modulation M(t) can be absorbed into the circuit equations (Equation 1). The noise inputs u(t) to the circuit can then be assumed to be stationary without loss of generality. This procedure, however, increases the size of the harmonic balance system for obtaining the steady state x*. To avoid this and to separate the implementation of the noise analysis method from the harmonic balance steady state analysis method, the formulation of this section is preferred.

E. Bandpass Filtering of Cyclostationary Noise

An example of the application of the method of the invention, and a non-trivial result in itself, is the analysis of bandpass filtering of cyclostationary noise. It is expected that this practical application of the method of the invention might lead to useful RF designs.

Ström and Signell (*Analysis of Periodically Switched Linear Circuits*. IEEE Trans. Ckts. Syst., CAS-24(10):531–541, Oct. 1977) have shown that low-pass filtering of cyclostationary noise results in stationary noise if the bandwidth of the low-pass filter is less than half the frequency of cyclostationarity $\omega_O$. In this section, the effect of Linear Time Invariant (LTI) band-pass filtering on cyclostationary noise is considered. It is shown that if cyclostationary noise is passed through a one-sided (i.e., single-sideband) band-pass filter of bandwidth less than $\omega_0/2$ the output noise is stationary. This result is obtained using a simple visualization of the propagation of harmonic PSDs.

Denote the input noise to a band-pass filter by n(t) and the output noise by x(t).

Assume that the input n(t) is cyclostationary with period $$T = \frac{2\pi}{\omega_0}.$$

Denote the transfer function of the band-pass filter by H(ω). The relationship between the harmonic PSDs of n(t) and x(t), derived from Equation 21 by using the fact that H is block diagonal for a LTI network, is:

$$S_{xx_i}(\omega) = H(-\omega)H^T(\omega + i\omega_0) \quad (40)$$

Note that the $i^{th}$ harmonic PSD of the output is determined completely by the corresponding harmonic PSD of the input, shaped by the product of the filter function H(ω) with a shifted version of itself $H^T(\omega + i\omega_0)$. For the scalar input-output case under consideration, the relation simplifies to:

$$S_{xx_i}(\omega) = H(-\omega)H(\omega + i\omega_0)S_{nn_i}(\omega) \quad (41)$$

Since the magnitude of H(ω) for a real filter is symmetric about zero, H(−ω) has the same magnitude characteristic as H(ω). By overlaying the magnitudes of H(ω) and H(ω+iω₀) for different values of i (illustrated in FIG. 1), it can be seen that the product H(−ω)H(ω+iω₀) is nonzero only for i=0, 2, and −2 if the bandwidth of H(ω) is less than $\omega_0/2$ For all other values of i, there is no frequency at which H(−ω) and H(ω+iω₀) are both nonzero, hence their product is identically zero.

This immediately implies the following result:

Result 1

Figure 2:
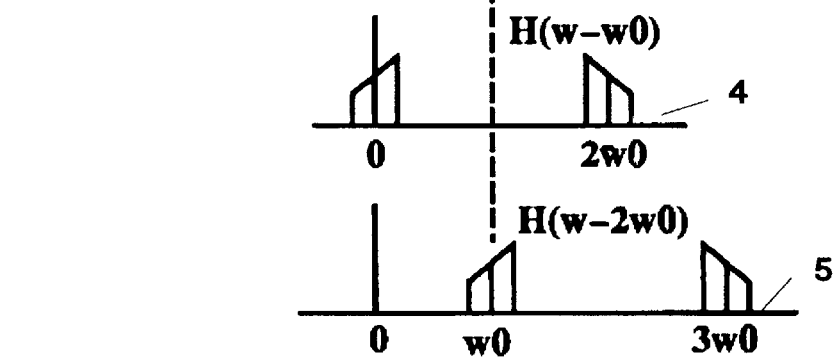
FIG. 2 shows graphs of one-sided $H(\omega)$ overlaid with $H(\omega+i\omega_o)$ for i=2 and −2.
Figure 2:
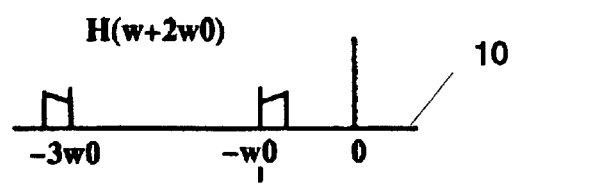
Figure 2:
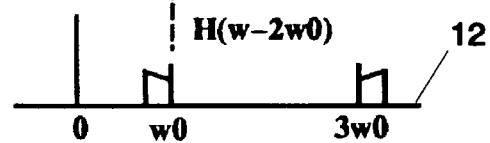

Bandpass Filtering with Bandwidth less than $\omega_0/2$ Eliminates all Harmonic PSDs except the Stationary and Second Harmonic PSDs Moreover, if the band-pass filter is one-sided with respect to $\omega_0$, then the product H(ω)H(ω+iω₀) is identically zero also for i=2 and −2, as illustrated in FIG. 2. In this case, the bandwidth of the filter can be greater than $\omega_0/2$ but should be less than $\omega_0$. The only nonzero PSD of the output is then the stationary PSD. This implies Result 2

Figure 12:
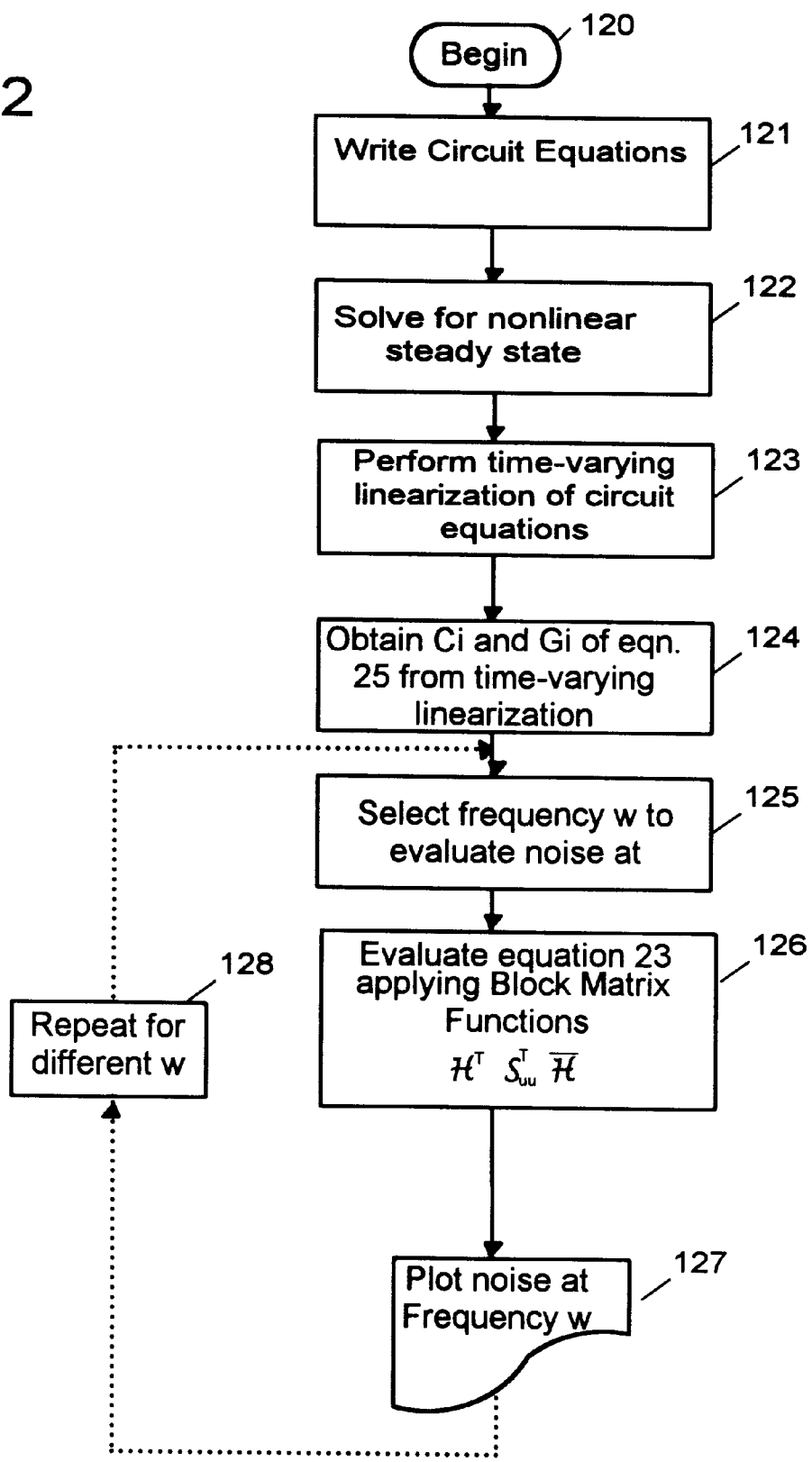
FIG. 12 shows a flowchart of the method of the invention.

One-sided (or Single-sideband) Bandpass Filtering (with Bandwidth less than $\omega_0$) of Cyclostationary Noise Results in Stationary Output Noise F. Summary of the Method of the Invention Thus, the method of the invention can be summarized as follows (line numbers refer to blocks in the flowchart of FIG. 12):

120. Begin
121. Write the equations characterizing the circuit, in terms of the time-domain circuit variables (x(t)), a vector of large-signal excitations (b(t)), the resistive elements of the circuit (f(x(t))), the dynamic elements of the circuit (q(x(t)), and the small perturbations of the system (Δu(t)).
122. Solve the equations for a nonlinear steady state
123. Perform a time-varying linearization of the circuit equations, giving the Linearized Small Signal Differential Equations, in terms of the derivative matrices of resistive and dynamic elements of the circuit.
124. Obtain $C_i$ and $G_I$ using the equations $$C(t) = \sum_{i=-\infty}^{\infty} C_i e^{ji\omega_0 t}, G(t) = \sum_{i=-\infty}^{\infty} G_i e^{ji\omega_0 t}$$

(Equations 25 (see Section C, above))
125. Select a frequency $\omega$ to evaluate noise at.
126. Evaluate the equation $S^T_{xx(\cdot,0)(\cdot,p)}(\omega) = \overline{H}(\omega)S^T_{uu}(\omega)H^T(\omega)E_0 e_p$ (equation 23—see sections C and D, above), applying Block Matrix functions $H^T$, $S^T_{uu}$ and $\overline{h}$
127. Plot the noise at frequency $\omega$
128. Repeat steps 125–127 for additional frequencies $\omega$ The method of the invention can be used to design and build a circuit, by a) providing a first circuit design; b) determining the performance of the first circuit design by mathematical analysis following the method of the invention; c) comparing the performance of the first. circuit design to a desired performance, with the performance of the first circuit design being within predetermined limits of the desired performance; and d) making the circuit in accordance with said first circuit design.

G. Experimental Results of Application of the Method of the Invention

The fast cyclostationary noise analysis method of the present invention is used in three circuit examples below.

EXAMPLE 1

A Mixer and Bandpass Filter

Figure 3:
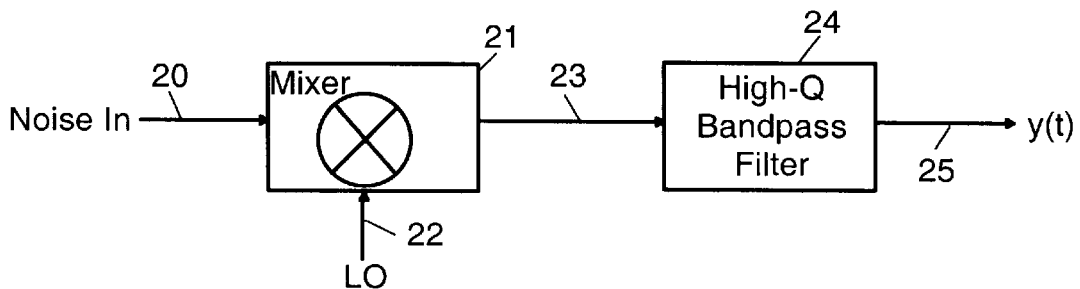
FIG. 3 shows a block diagram of a mixer and bandpass filter.
Figure 4:
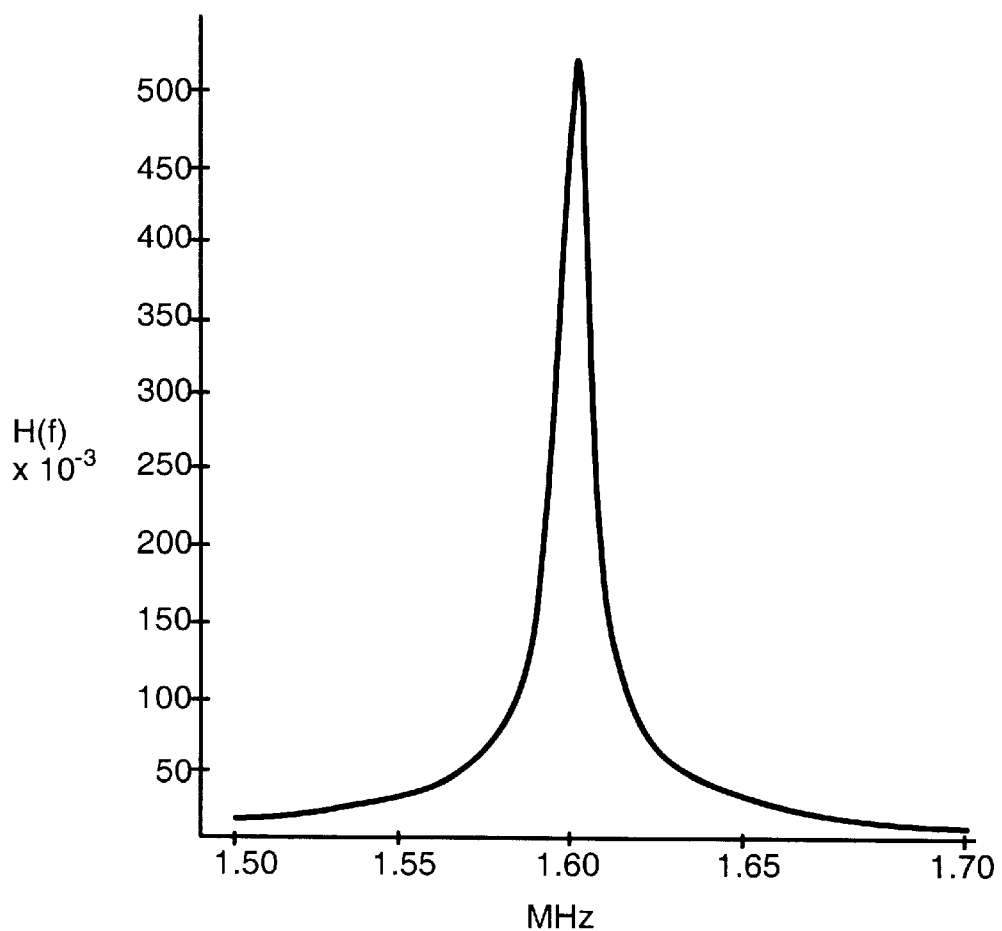
FIG. 4 shows a graph of the bandpass filter characteristic of the filter of FIG. 3.

FIG. 3 shows a block diagram of a mixer (21) and High-Q bandpass filter (24) circuit. The method of the invention is used to analyze the circuit for cyclostationary noise propagation. The mixer (21) is an ideal multiplier that modulates the incoming stationary noise (20) with a deterministic local oscillator (LO) signal (22) of $\cos(2\pi f_0 t)$. The mixer (21) output (23) is connected to the High-Q bandpass filter (24), the output (25) of which is denoted as filter output noise y(t). The filter (24) has a high-Q bandpass characteristic (illustrated in FIG. 4) with a center frequency of approximately 1.592 Mhz and a bandwidth of about 50 KHz. The stationary input noise (20) is bandlimited with double-sided bandwidth of about 200 KHz.

Two simulations are carried out, with $f_o$ set to 1.592 Mhz and 1.5 Mhz respectively. In the first situation, the bandpass filter is centered at the LO frequency. In the second, the filter characteristic is offset to the right of the LO frequency, strongly attenuating the lower sideband with respect to $f_o$ while passing the upper sideband. Harmonic PSDs at all nodes in the circuit were computed over frequencies from 1 Mhz to 2 Mhz. Using the results of Section A, it can be shown that only the stationary and second harmonic PSDs of the mixer output x(t) are nonzero, related to the PSD of the stationary input by:

$$S_{xx_0}(\omega) = \frac{S_{nn_0}(\omega - \omega_0) + S_{nn_0}(\omega - \omega_0)}{4}, \quad (42)$$

$$S_{xx_{-2}}(\omega) = \frac{S_{nn_0}(\omega - \omega_0)}{4}, \text{ and}$$

$$S_{xx_2}(\omega) = \overline{S_{xx_{-2}}(-\omega)}$$

Figure 5A:
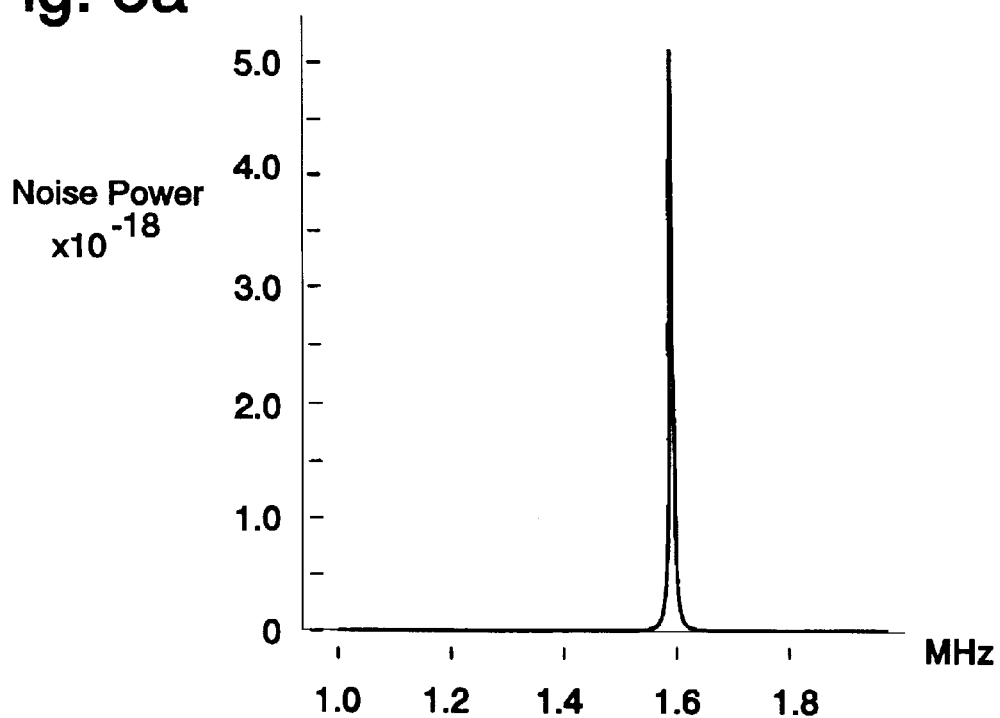
FIG. 5a shows a graph of the stationary PSD of the bandpass filter (double sideband filtering) output y(t) for $f_o$=1.592 Mhz: $S_{yy_0}(f)$—noise power vs. frequency.
Figure 5B:
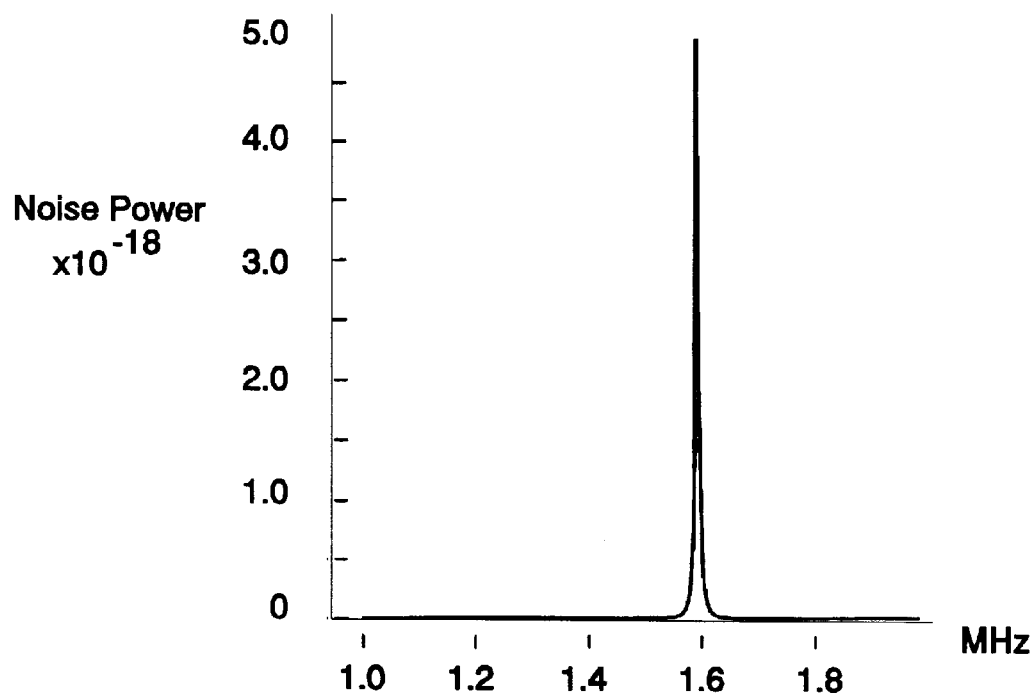
FIG. 5b shows a graph of the second harmonic PSD of the bandpass filter (double sideband filtering) output y(t) for $f_o$=1.592 Mhz: $S_{yy_{-2}}(f)$—noise power vs. frequency.
Figure 6A:
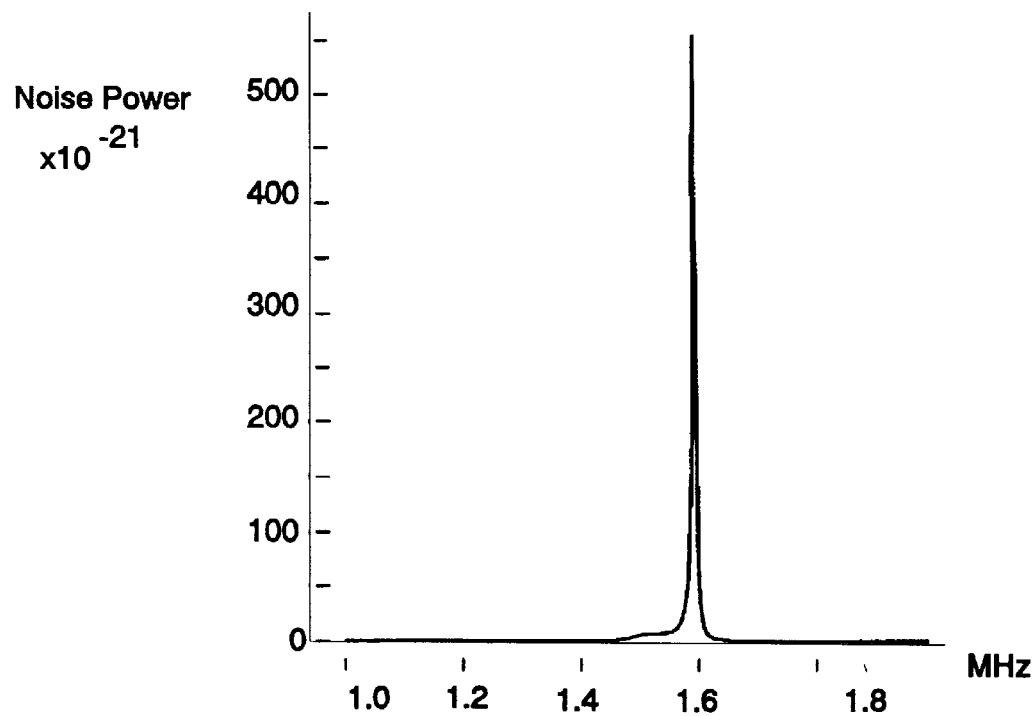
FIG. 6a shows the PSD of FIG. 5a for the single-sideband $f_0$=1.5 Mhz case.
Figure 6B:
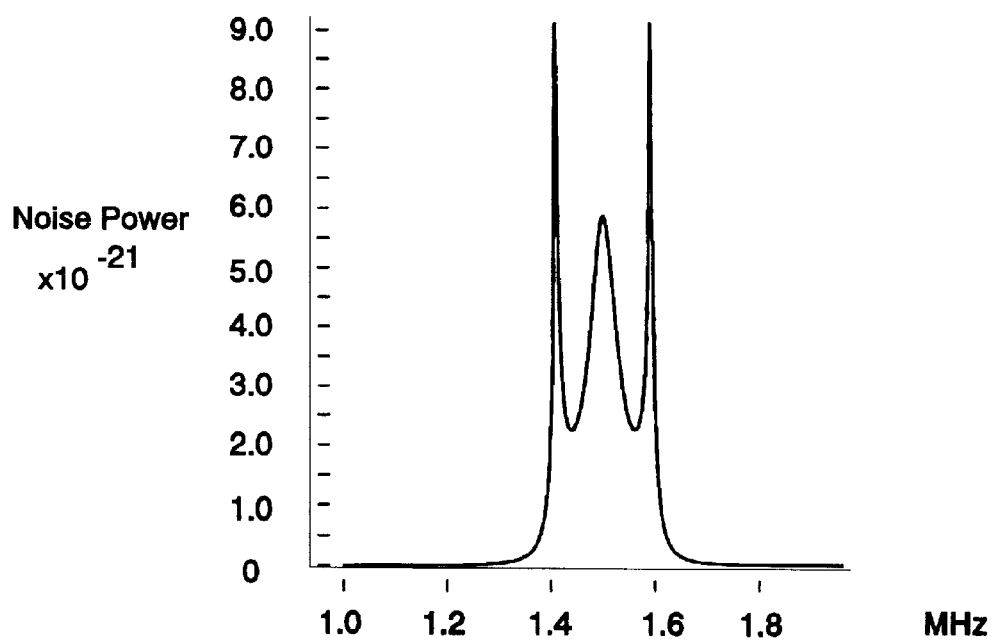
FIG. 6b shows the PSD of FIG. 5b for the single-sideband $f_0$=1.5 Mhz case.

The stationary and second harmonic PSDs of the filter output y(t) for $f_o$=1.592 Mhz (double sideband filtering) are shown in FIGS. 5a and 5b, respectively. It can be seen that both PSDs have the same magnitude, hence there is a large cyclostationary component in the noise. The same PSDs for the $f_o$=1.5 Mhz case (single sideband filtering) are shown in FIGS. 6a and 6b, respectively. The second harmonic PSD (FIG. 6b) can be seen to be about two orders of magnitude smaller than the stationary PSD (FIG. 6a). Hence the filtered noise is virtually stationary, as predicted in Section D, above. The second harmonic PSD is not identically zero because the non-ideal single-sideband filter does not perfectly eliminate the lower sideband.

The above results were also verified by simulations using the Monte-Carlo method. The nonlinear differential equations of the circuit in FIG. 3 were solved numerically with 60,000 samples of the input noise n(t). The input noise PSD was normalized to 1 to avoid corruption of the results by numerical noise generated during differential equation solution. The 60,000 samples of the mixed and filtered noise y(t) were squared and averaged, on a per-timepoint basis, to obtain the noise power at the output as a function of time.

Figure 7A:
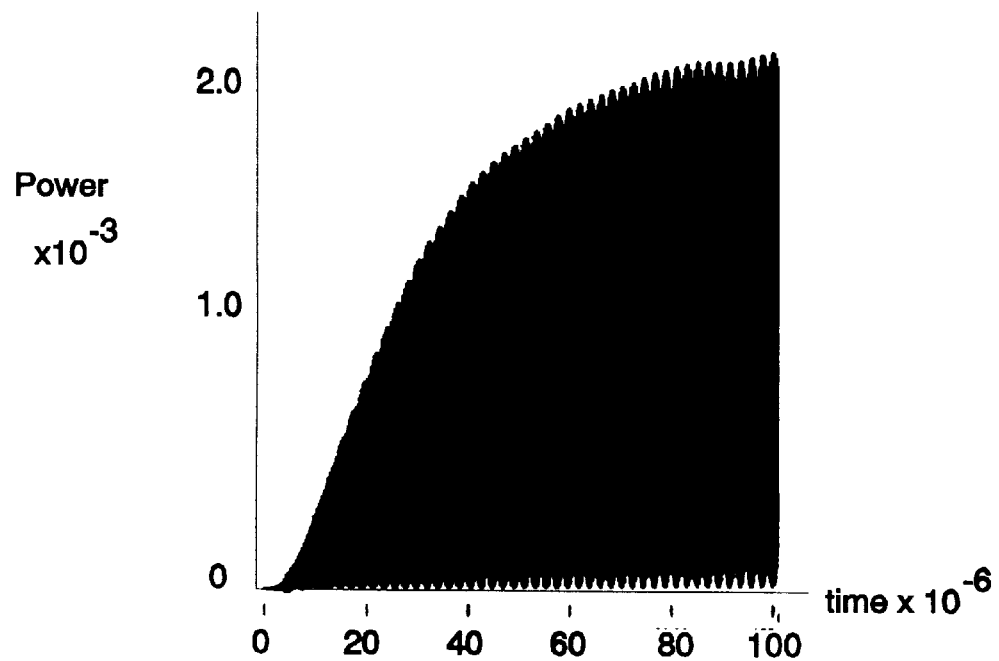
FIG. 7a shows the variation in noise power with time for the double sideband case of Figs. 5a and 5b.
Figure 7B:
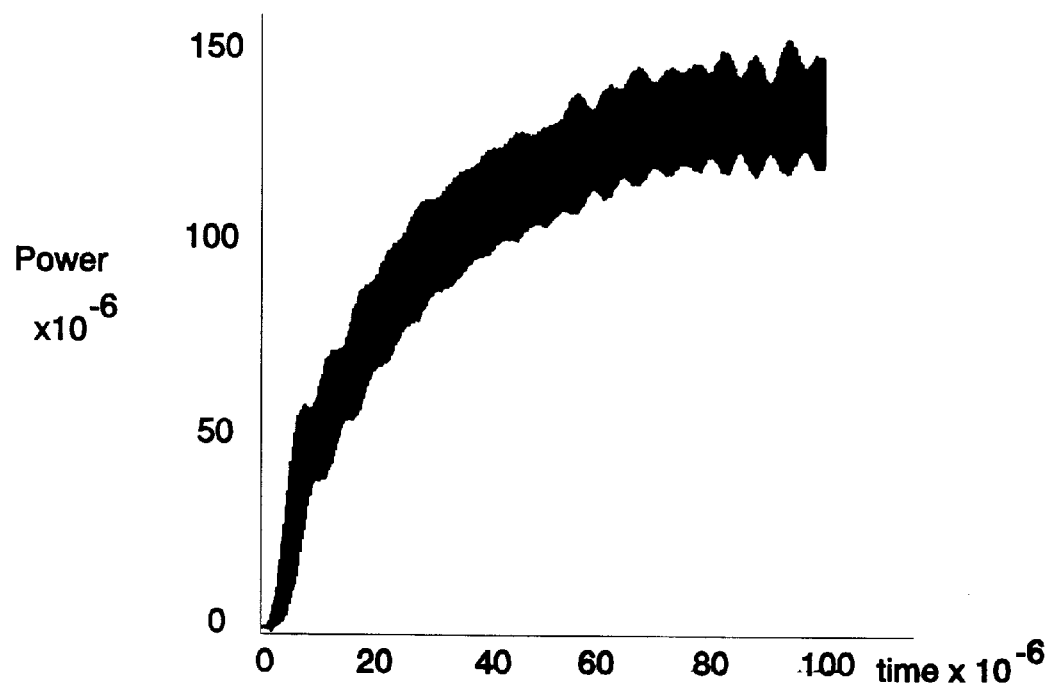
FIG. 7b shows the variation in noise power with time for the single sideband case of FIGS. 6a and 6b.

The variation of noise power with time is shown for the double-sideband (FIG. 7a) and single-sideband (FIG. 7b) cases. When analyzed in the time domain, the circuit requires some time to reach large-signal steady state, hence the steady state noise power is approached toward t=100 ms. In contrast, harmonic balance calculates this steady state directly. The cyclostationarity of the noise in the double-sideband case (FIG. 7a) can be seen from the variation of the power between zero and its maximum value of about 0.0022. In the single-sideband case FIG. 7b), the power approaches a steady value of about $130 \times 10^{-6}$, with a cyclostationary variation of about 10%.

Accounting for the normalization of the input PSD, these values are in excellent agreement with the total integrated noise of $S_{yy_0}(f)$ and $S_{yy-2}(f)$( FIG. 6); Monte-Carlo simulation results are within 2% of the results produced by the new analysis method.

EXAMPLE 2

Diode-Resistor-Capacitor Circuit

Figure 8:
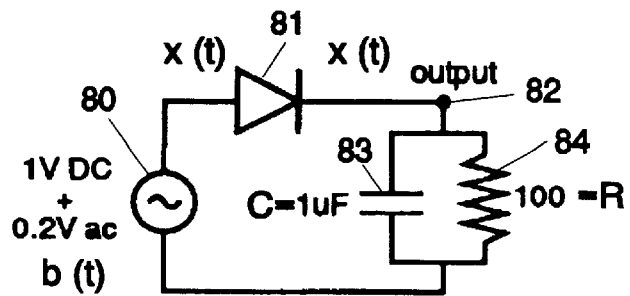
FIG. 8 shows a schematic of a simple diode-RC circuit.

FIG. 8 shows a simple diode-resistor-capacitor circuit. A source of DC power, optionally combined with a sinusoidal AC signal (80) is connected to a series circuit of a diode (81) and a parallel-connected 100 A resistor (83) and 1 μf capacitor (83). The circuit output is taken at point (82), between the diode (81) and the capacitor (83)/resistor (84) pair.

The circuit in FIG. 8 was analyzed for cyclostationary noise using the method of the invention. The object was to investigate the effect of large-signal variations on the shot noise generated by the diode (81). For this reason, the 100 A resistor was made noiseless for this analysis. The RC pole is at about 1 KHZ.

The equations for the example are:

$$\frac{d}{dt}\left(\begin{bmatrix} C & 0 \\ 0 & 0 \end{bmatrix}\begin{bmatrix} x_1(t) \\ x_2(t) \end{bmatrix}\right) + \begin{bmatrix} \frac{x_1(t)}{R} - d(x_2(t) - x_1(t)) \\ x_2(t) \end{bmatrix} + \begin{bmatrix} 0 \\ -b_2(t) \end{bmatrix} = 0 \quad (43)$$

where d(v) is the diode function:

$$d(v) = I_s\left(e^{-\frac{v}{v_t}} - 1\right) \quad (44)$$

Figure 9A:
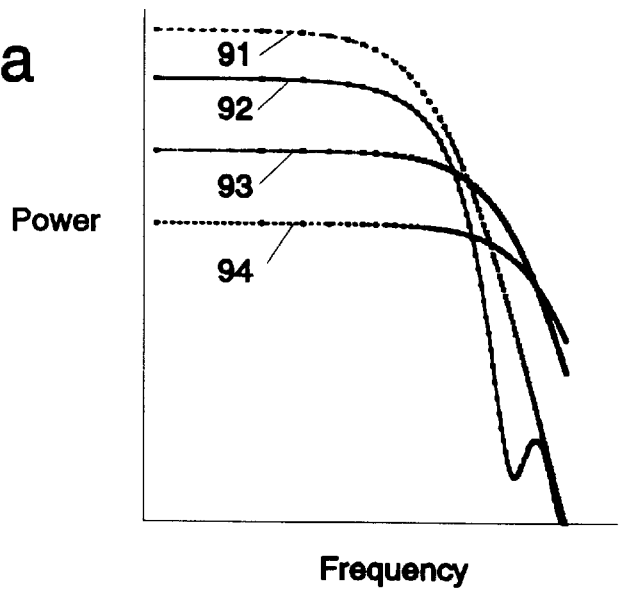
FIG. 9a shows the stationary PSDs of the circuit of FIG. 8 for DC and (DC+AC) excitations.
Figure 9B:
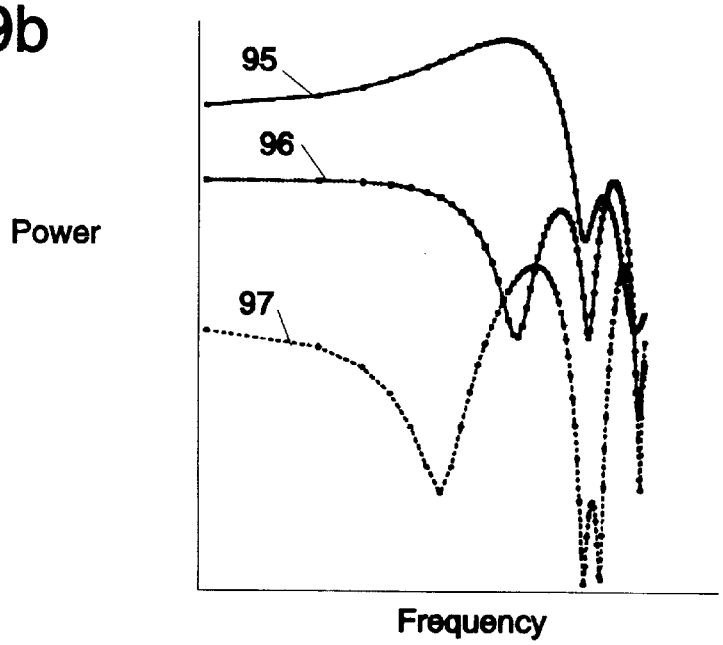
FIG. 9b shows the 1st–3rd harmonic PSDs of the circuit of FIG. 8 for 1VDC+0.2 VAC excitation.

Four analyses were performed: three stationary analyses with the circuit in DC steady state (with the voltage source at 1VDC, 0.8VDC and 1.2VDC respectively), and one cyclostationary analysis with the source at 1VDC plus a sinusoidal voltage of amplitude 0.2V at 10 KHz. The results are shown in FIGS. 9a and 9b. FIG. 9a shows the stationary PSDs from the four simulations: 0.8VDC (91), 1VDC+ 0.2VAC (92), 1.0VDC (93) and 1.2VDC (94).

It can be seen (line (92), FIG. 9a) that large-signal ac excitation (1V DC+0.2V AC) leads to higher stationary noise in the flat band, compared to the noise resulting from purely DC excitation at 1V (93). Interestingly, however, the high-frequency roll-off is faster in the AC excitation case, and the high-frequency noise in this case approaches that with DC excitation at 0.8V (91).

The first three harmonic PSDs of the cyclostationary output noise are also shown, in FIG. 9b, for the AC excitation case: first harmonic (95), second harmonic (96) and third harmonic (97).

EXAMPLE 3

A Gilbert Cell

Figure 10:
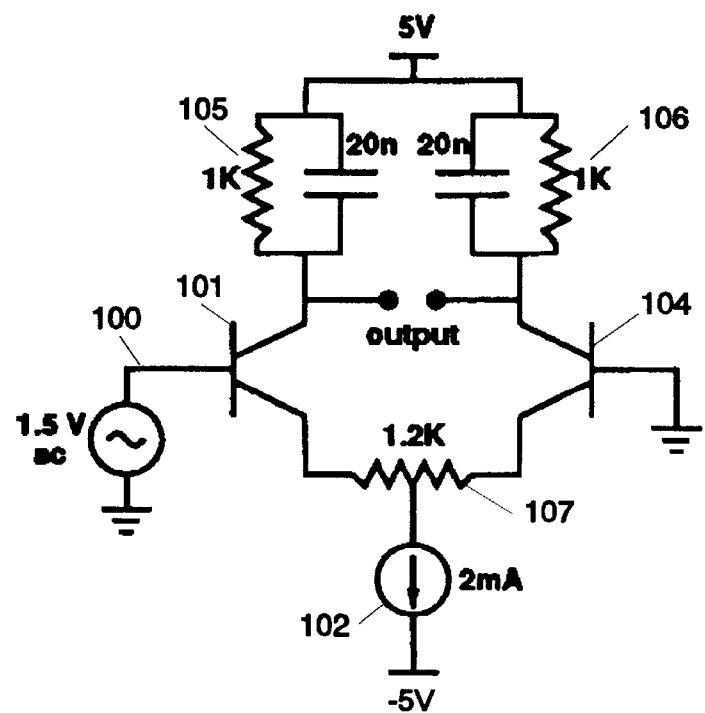
FIG. 10 shows a schematic of a Gilbert cell mixer.

The Gilbert cell mixer in FIG. 10 was analyzed for cyclostationary noise to investigate the effect of large-signal local oscillator variations on the output noise. The LO (100) signal of amplitude 1.5VAC is applied at the base of the first transistor (101). The RF input signal is applied through the current source (102), which is held at a DC value of 2 mA (i.e., no RF signal) for the noise analysis. Noise is contributed by the bipolar devices (101) and (104) and resistors (105), (106) and (107); the bipolar devices contain three noise generators each (thermal noise of extrinsic base resistance, shot noises at base and collector).

Figure 11A:
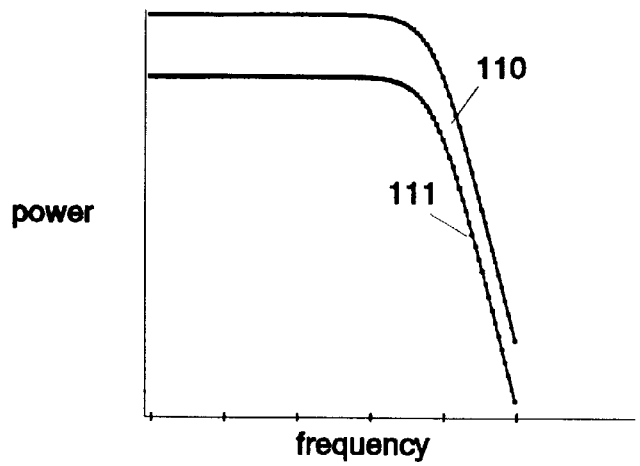
FIG. 11a shows the stationary PSDs for the circuit of FIG. 10 with no local oscillator (LO) and with LO=1.5V.
Figure 11B:
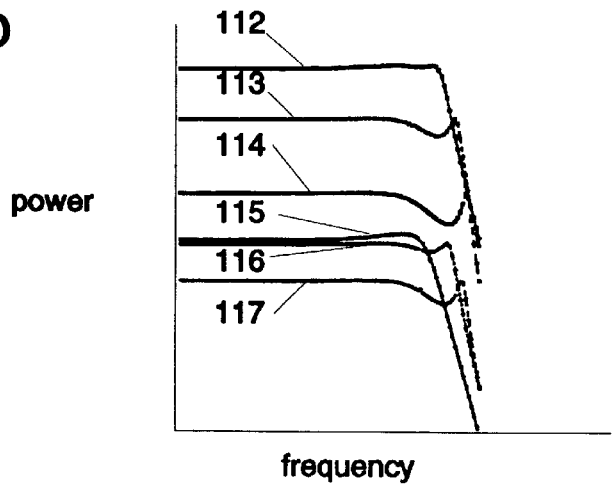
FIG. 11b shows the 1st–6th harmonic PSDs for the circuit of FIG. 10 with LO=1.5V.

Two simulations were performed: a stationary analysis with no LO present to obtain the noise of the quiescent circuit, and a cyclostationary analysis with the LO amplitude at 1.5V. The results are shown in FIGS. 11a and 11b. In FIG. 11a, line (110) represents the noise power without local oscillator signal and line (111) represents the noise power with local oscillator at 1.5VAC.

From FIG. 11a, it can be seen that having a large LO signal (111) reduces the average noise power at the output. This is a known property of switching mixers.

FIG. 11b shows the first six harmonic PSDs of the noise at the output when the LO is 1.5V: first (115), second (112), third (116), fourth (113), fifth (117) and sixth (117) harmonic PSDs. It can be seen that the even harmonic PSDs (112), (113) and (114) predominate. This result is also consistent because the even harmonic PSDs are dominated by the differential large-signal output, whereas the odd harmonic PSDs (115), (116) and (117) are related to the common-mode large-signal output.

H. Conclusion

The invention presents an efficient frequency-domain analysis method for computing noise power spectral densities (PSDs) in nonlinear circuits. The method uses harmonic components of periodic time-varying power spectral densities in its noise formulation. A block-structured matrix equation for the output noise statistics is the central result enabling the fast analysis method. Filtering of cyclostationary noise is analyzed using harmonic PSDs and it is shown that one-sided bandpass filtering produces stationary noise. This extends a previously known result for lowpass filtering. The new analysis method is applied to analyze cyclostationary noise in three circuits. Results from the new analysis method match Monte-Carlo simulation outputs to an accuracy of 2%.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method of analyzing a circuit, comprising the steps of:

a) writing the equations characterizing the circuit, in terms of the time-domain circuit variables x(t), a vector of large-signal excitations b(t), the resistive elements of the circuit f(x(t)), the dynamic elements of the circuit q(x(t)), and the small perturbations of the system Au(t);

b) solving the equations from step (a) for a nonlinear steady state;

c) performing a time-varying linearization of the circuit equations from step (a), giving the linearized small signal differential equation, in terms of the derivative matrices of resistive and dynamic elements of the circuit, giving the equation $C(t)\dot{x} + G(t)x + Au(t) = 0,$ where x(t) represents the small-signal deviations of the perturbed solution of the equations of step (a), C(t) is the derivative matrix of f(•), and G(t) is the derivative matrix of q(•);

d) obtain $C_i$ and $G_i$ using the equations $$C(t) = \sum_{i=-\infty}^{\infty} C_i e^{ji\omega_0 t}, \quad G(t) = \sum_{i=-\infty}^{\infty} G_i e^{ji\omega_0 t} \text{ where}$$

e) selecting a frequency ω for which noise is to be evaluated;

f) evaluate the equation $S^t_{xx(\cdot,0)(\cdot,p)}(\omega) = \overline{H}(\omega) S^T_{uu}(\omega) H^t(\omega) E_0 e_p$ applying block matrix functions $H^T$, $S^T_{uu}$ and $\overline{H}$ analyzing the propagation of noise through the circuit using the linearized small signal differential equations;

g) if a noise characteristic of the circuit is not within predetermined limits, modifying the circuit in accordance with the evaluation.

2. The method of claim 1, in which the equations of step (a) are in the form:

$\dot{q}(x(t)) + f(x(t)) + b(t) + Au(t) = 0.$

3. The method of claim 1, in which $$C(t) = \frac{\partial q(x)}{\partial x}\bigg|_{x=x^*},\ G(t) = \frac{\partial f(x)}{\partial x}\bigg|_{x=x^*} + \frac{\partial^2 q(x)}{\partial x^2}\bigg|_{x=x^*}\dot{x}^*,\ \text{where } x^*$$

is the large signal solution of the equation of step (a) with u(t) set to 0.

4. The method of claim 1, in which the evaluation of step 1(e) comprises the steps of:
 a) defining the input/output relationship of the circuit using the formula $$x(t_2) = \int_{-\infty}^{\infty} h(t_2, t_1) u(t_1) dt_1;$$

where $h(t_2,t_1)$ is a matrix representing the time-varying impulse response of the circuit;
 b) defining $R_{xx}$ and $R_{uu}$, the covariance matricies of x(t) and u(t), $R_{xx}$ and $R_{uu}$ being termed the harmonic covariances of the output and input noise, respectively;
 c) relating $R_{xx}$ and $R_{uu}$ in one equation;
 d) expanding $h(t_2,t_1)$ in a Fourier series, giving the harmonic transfer functions;
 e) converting the equation of step 3(c) to the frequency domain by relating the two-dimensional Fourier transforms of $R_{xx}$ and $R_{uu}$;
 f) deriving the two-dimensional power spectral densities $S_{xx}$ and $S_{uu}$ from the Fourier transforms of the harmonic covariances, assuming a cyclostationary noise;
 g) relating the two-dimensional spectral densities derived in step (f) and rewriting in terms of the one-dimensional harmonic power spectral densities, giving the relationship, in block matrix form:

$$S_{xx}(\omega)) = H(\omega) S_{uu}(\omega) H^*(\omega),\ \text{where } H^* \text{ denotes the Hermitian of } H,\ S_{xx},\ S_{uu}.$$

5. The method of claim 1, further comprising the step of repeating steps (e), (f) and (g) for additional frequencies.

6. A method of making a circuit, comprising the steps of:
 a) providing a first circuit design;
 b) determining a noise characteristic of the first circuit design by mathematical analysis;
 c) comparing the noise characteristic of the first circuit design to a desired noise characteristic, with the noise characteristic of the first circuit design being within predetermined limits of the desired noise characteristic; and
 d) making the circuit in accordance with said first circuit design; wherein step b) comprises the steps of:
  i) writing the equations characterizing the circuit, in terms of the time-domain circuit variables x(t), a vector of large-signal excitations b(t), the resistive elements of the circuit f(x(t)), the dynamic elements of the circuit q(x(t)), and the small perturbations of the system Au(t);
  ii) solving the equations from step (a) for a nonlinear steady state;
  iii) performing a time-varying linearization of the circuit equations from step (d)(i), giving the linearized small signal differential equation, in terms of the derivative matrices of resistive and dynamic elements of the circuit giving the linearized small signal differential equation, in terms of the derivative matrices of resistive and dynamic elements of the circuit, giving the equation $$\dot{C}(t)\dot{x} + G(t)x + Au(t) = 0,$$

where x(t) represents the small-signal deviations of the perturbed solution of the equations of step (a), C(t) is the derivative matrix of f(•), and G(t) is the derivative matrix of q(•);
  iv) obtain $C_i$ and $G_i$ using the equations $$C(t) = \sum_{i=-\infty}^{\infty} C_i e^{ji\omega_0 t},\ G(t) = \sum_{i=-\infty}^{\infty} G_i e^{ji\omega_0 t}$$

where $C_i$ and $G_i$ are the harmonics of $C(t)$ and $G(t)$ v) selecting a frequency ω for which noise is to be evaluated;
  vi) evaluate the equation $$S^t_{xx(\cdot,0)(\cdot,p)}(\omega) = \overline{H}(\omega) S^T_{uu}(\omega) H^t(\omega) E_0 e_p$$

applying block matrix functions $H^T$, $S^T_{uu}$ and $\overline{H}$ analyzing the propagation of noise through the circuit using the linearized small signal differential equations;
  vii) outputting a graphical plot of the noise at frequency ω.

7. The method of claim 6, further comprising:
 providing, prior to steps a)–c), a second circuit design that differs from said first circuit design,
 determining the noise characteristic of the second circuit design by said mathematical analysis,
 comparing the noise characteristic of the second circuit design to said desired noise characteristic,
 if the noise characteristic of the second circuit design is not within said predetermined limits of the desired noise characteristic, changing the second circuit design in response to the result of the comparing step, the changed second circuit design being said first circuit design.

8. The method of claim 6, in which the equations of step 6(d)(i) are in the form:

$$\dot{q}(x(t)) + f(x(t)) + b(t) + Au(t) = 0.$$

9. The method of claim 6, in which $$C(t) = \frac{\partial q(x)}{\partial x}\bigg|_{x=x^*},\ G(t) = \frac{\partial f(x)}{\partial x}\bigg|_{x=x^*} + \frac{\partial^2 q(x)}{\partial x^2}\bigg|_{x=x^*}\dot{x}^*,$$

where x* is the large signal solution of the equation of step (a) with u(t) set to 0.

10. The method of claim 6, in which the analysis of step 6(d)(iv) comprises the steps of:
 a) defining the input/output relationship of the circuit using the formula $$x(t_2) = \int_{-\infty}^{\infty} h(t_2, t_1) u(t_1) dt_1;$$

where $h(t_2,t_1)$ is a matrix representing the time-varying impulse response of the circuit;
 b) defining $R_{xx}$ and $R_{uu}$, the covariance matricies of x(t) and u(t), $R_{xx}$ and $R_{uu}$ being termed the harmonic covariances of the output and input noise, respectively;

c) relating $R_{xx}$ and $R_{uu}$ in one equation;
d) expanding $h(t_2,t_1)$ in a Fourier series, giving the harmonic transfer functions;
e) convert the equation of step 3(c) to the frequency domain by relating the two-dimensional Fourier transforms of $R_{xx}$ and $R_{uu}$;
f) deriving the two-dimensional power spectral densities $S_{xx}$ and $S_{uu}$ from the Fourier transforms of the harmonic covariances, assuming a cyclostationary noise;
g) relating the two-dimensional spectral densities derived in step (f) and rewriting in terms of the one-dimensional harmonic power spectral densities, giving the relationship, in block matrix form:

$$S_{xx}(\omega)=H(\omega)S_{uu}(\omega)H^*(\omega), \text{ where } H^* \text{ denotes the Hermitian of } H, S_{xx}, S_{uu}.$$

* * * * *